(12) United States Patent
Kim et al.

(10) Patent No.: US 8,392,806 B2
(45) Date of Patent: Mar. 5, 2013

(54) METHOD, DEVICE, AND DIGITAL CIRCUITRY FOR PROVIDING A CLOSED-FORM SOLUTION TO A SCALED ERROR LOCATOR POLYNOMIAL USED IN BCH DECODING

(75) Inventors: Hun-Seok Kim, Addison, TX (US); Seok-Jun Lee, Allen, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 435 days.

(21) Appl. No.: 12/846,172

(22) Filed: Jul. 29, 2010

(65) Prior Publication Data

US 2011/0055668 A1    Mar. 3, 2011

Related U.S. Application Data

(60) Provisional application No. 61/239,317, filed on Sep. 2, 2009.

(51) Int. Cl.
*H03M 13/00* (2006.01)
(52) U.S. Cl. ........................................ 714/782
(58) Field of Classification Search .................. None
See application file for complete search history.

(56) References Cited

U.S. PATENT DOCUMENTS

| | | | | |
|---|---|---|---|---|
| 5,343,481 A * | 8/1994 | Kraft | ............... | 714/782 |
| 5,436,916 A * | 7/1995 | Nakamura | ............... | 714/785 |
| 5,537,426 A * | 7/1996 | Lee | ............... | 714/785 |
| 6,131,178 A * | 10/2000 | Fujita et al. | ............... | 714/784 |
| 6,487,691 B1 * | 11/2002 | Katayama et al. | ............... | 714/784 |
| 6,792,569 B2 * | 9/2004 | Cox et al. | ............... | 714/781 |
| 2004/0210816 A1 * | 10/2004 | Ohyama et al. | ............... | 714/758 |

OTHER PUBLICATIONS

Dilip V. Sarwate et al.; High-Speed Architectures for Reed—Solomon Decoders; IEEE Transactions on Very Large Scale Integration (VLSI) Systems, vol. 9, No. 5, Oct. 2001; pp. 641-655.
Herbert O. Burton; Inversionless Decoding of Binary BCH Codes; IEEE Transactions on Information Theory, vol. IT-17, No. 4, Jul. 1971; pp. 464-466.
VLSI Design of Inverse-Free Berlekamp-Massey Algorithm; IEEE Proceedings, vol. 138, No. 5, Sep. 1991.

* cited by examiner

*Primary Examiner* — Gabriel Chu
(74) *Attorney, Agent, or Firm* — Steven A. Shaw; W. James Brady; Frederick J. Telecky, Jr.

(57) ABSTRACT

A method of determining positions of one or more error bits is disclosed. The method includes receiving a BCH codeword at input circuitry of a decoder device, establishing a threshold number of correctable bits, and determining from the received BCH codeword and a root of an encoder polynomial, a value of each of one or more syndromes. The number of the one or more syndromes is twice a maximum number of correctable bits in the received BCH codeword. When the maximum number of correctable bits in the received BCH codeword is less than the threshold number of correctable bits, the value of each coefficient in a scaled error locator polynomial is determined by performing a non-iterative, closed-form solution on the scaled error locator polynomial. The scaled error locator polynomial is an original error locator polynomial scaled by a constant scale factor. The constant scale factor is determined according to the value of each of the one or more syndromes. Having determined the value of each coefficient in the scaled error locator polynomial, one or more roots of the scaled error locator polynomial are obtained. Each of the one or more roots indicates a position of an error bit. A BCH decoder device that can implement the method and a digital circuit that preserves operations implementing the method are also disclosed.

20 Claims, 4 Drawing Sheets

METHOD, DEVICE, AND DIGITAL CIRCUITRY FOR PROVIDING A CLOSED-FORM SOLUTION TO A SCALED ERROR LOCATOR POLYNOMIAL USED IN BCH DECODING

CROSS-REFERENCE TO RELATED APPLICATIONS

This application claims the benefit of U.S. provisional application 61/239,317, filed Sep. 2, 2009, which is expressly incorporated herein by reference.

TECHNICAL FIELD

The technical field relates to decoding BCH codes, and more specifically to determining positions of error bits in encoded BCH code.

BACKGROUND

BCH codes form a class of parameterized, error-correcting codes that were developed by Alexis Hocquenghem, and independently by Raj Chandra Bose and Dwijendra Kumar Ray-Chaudhuri. The acronym "BCH" is formed simply from initials of the three individuals named above. A principal advantage of BCH codes is that decoding can be performed via an elegant algebraic method known as syndrome decoding.

Syndrome decoding is of relatively low complexity, and can be performed by very simple, low-level electronic hardware. BCH codes are thus very popular for low power communication systems, and decoding devices utilizing BCH codes can be made very small. BCH code is employed in communication systems such as deep space communication, digital subscriber loops (DSL), and short range wireless communication systems. Additional applications of BCH codes include biomedical devices communicating measurements of physical data measured inside the body. Examples of communication standards for such biomedical devices include IEEE standard P802.15.6 (Personal Area Network Physical Layer Standard) and IEEE standard P802.15-09-0329-00-0006 (Wireless Personal Area Networks Standard, also referred to as the MedWiN Physical Layer Proposal).

In general, BCH decoding includes three modules: a syndrome computation module, an Error Locator Polynomial (ELP) solver module, and a Chien search and error evaluator module. Conventional ELP solver modules employ an iterative algorithm to determine the coefficients of an error locator polynomial, thereby providing the location of error bits in encoded BCH code. Embodiments disclosed herein presents a closed-form solution to a scaled error locator polynomial that reduces complexity in the ELP solver module as well as in a decoder device overall.

SUMMARY

Accordingly, one embodiment described herein is a method of determining positions of one or more error bits. The method includes receiving a BCH codeword at input circuitry of a decoder device, establishing a threshold number of correctable bits, and determining from the received BCH codeword and a root of an encoder polynomial, a value of each of one or more syndromes, the one or more syndromes being twice a maximum number of correctable bits in the received BCH codeword. When the maximum number of correctable bits in the received BCH codeword is less than the threshold number of correctable bits, the value of each coefficient in a scaled error locator polynomial is determined, in an implementing decoder device, by performing a non-iterative, closed-form solution on the scaled error locator polynomial. The scaled error locator polynomial is an original error locator polynomial scaled by a constant scale factor, and the constant scale factor is determined according to the value of each of the one or more syndromes. Having determined the value of each coefficient in the scaled error locator polynomial, one or more roots of the scaled error locator polynomial is obtained, each of the one or more roots indicating a position of an error bit. The received BCH codeword is a sum of the transmitted BCH codeword and the error bits; the transmitted BCH codeword is a product of a bit stream message and the encoder polynomial; the maximum number of correctable bits in the received BCH codeword is a property of the encoder polynomial; and the root of the encoder polynomial is a primitive number in a finite Galois field.

A second embodiment described herein is a decoder device that includes syndrome computation circuitry and ELP computation circuitry. The ELP computation circuitry establishes a threshold number of correctable bits. The syndrome computation circuitry determines from a received BCH codeword and a root of an encoder polynomial, a value of each of one or more syndromes, the one or more syndromes being twice a maximum number of correctable bits in the received BCH codeword. The ELP computation circuitry determines when the maximum number of correctable bits in the received BCH codeword is less than the threshold number of correctable bits, a value of each coefficient in a scaled error locator polynomial. The ELP computation circuitry utilizes a non-iterative, closed-form solution on the scaled error locator polynomial. The scaled error locator polynomial is an original error locator polynomial scaled by a constant scale factor, and the constant scale factor is calculated according to the value of each of the one or more syndromes determined by the syndrome computation circuitry. The ELP computation circuitry, having determined the value of each coefficient in the scaled error locator polynomial, further obtains one or more roots of the scaled error locator polynomial, each of the one or more roots indicating a position of an error bit. The received BCH codeword is a sum of the transmitted BCH codeword and one or more error bits; the transmitted BCH codeword is a product of a bit stream message and the encoder polynomial; the maximum number of correctable bits in the received BCH codeword is a property of the encoder polynomial; and the root of the encoder polynomial is a primitive number in a finite Galois field.

A third embodiment described herein is a digital circuit. The digital circuit has components configured to preserve operations that implement a method of determining positions of one or more error bits. The implemented method includes the same features as the method described above as the first embodiment.

It should be noted that the purpose of these summaries as well as the included Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The summaries and abstract are neither intended to define the invention of the application, which is measured by the claims, nor is it intended to be limiting as to the scope of the invention in any way.

BRIEF DESCRIPTION OF THE DRAWINGS

The accompanying figures, where like reference numerals refer to identical or functionally similar elements and which together with the detailed description below are incorporated in and form part of the specification, serve to further illustrate various exemplary embodiments and to explain various principles and advantages in accordance with the embodiments.

DETAILED DESCRIPTION

In overview, the present disclosure concerns BCH decoding. As described above, BCH decoding includes a syndrome computation module, an Error Locator Polynomial (ELP) solver module, and a Chien search and error evaluator module. Embodiments disclosed herein are directed toward a low complexity solution for the error locator polynomial solver module, thereby decreasing overall decoder complexity as well. Specifically, embodiments disclosed herein describe a non-iterative, closed-form solution on a scaled error locator polynomial.

The present disclosure is thus provided to further explain in an enabling fashion the best modes of performing the one or more embodiments. The disclosure is further offered to enhance an understanding and appreciation of claimed novel principles, and advantages accruing there from, rather than to limit the claims in any manner. The intellectually property rights ultimately afforded the applicants are defined solely by the appended claims including any amendments made during the pendency of this application and all equivalents of those claims as issued.

It is further understood that the use of relational terms such as first and second, and the like, if any, etc. are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Many of the novel principles described herein, when implemented, are best supported with integrated circuits (ICs) and/or application specific ICs. It is expected that one of ordinary skill, notwithstanding possibly significant effort and many design choices motivated by, for example, available time, current technology, and economic considerations, when guided by the concepts and principles disclosed herein, will be readily capable of generating such ICs with minimal experimentation. Therefore, in the interest of brevity and minimization of any risk of obscuring principles and concepts, further discussion of such ICs, if any, will be limited to the essentials with respect to the principles and concepts used by the exemplary embodiments.

Figure 4:
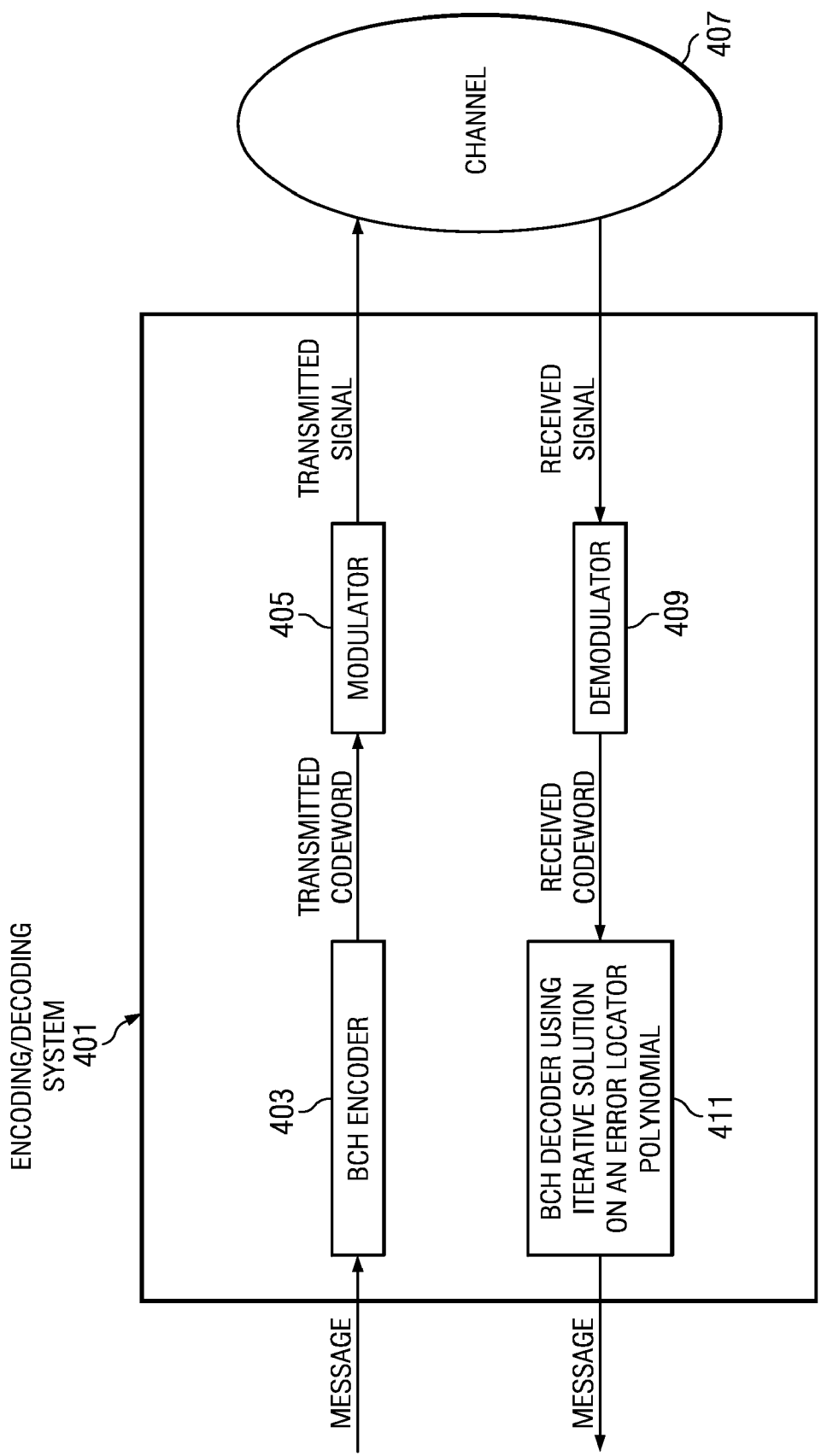
FIG. 4 is a block diagram illustrating a conventional BCH encoded/decoder system with a BCH decoder utilizing an iterative solution on an error locator polynomial.

Referring now to FIG. 4, a block diagram illustrating a conventional BCH encoded/decoder system 401 with a BCH decoder utilizing an iterative solution on an error locator polynomial will be discussed and described. The BCH encoder/decoder system 401 can includes a BCH encoder 403, a modulator 405, a channel 407, a demodulator 409, and a BCH decoder 411. As is known in the art, the BCH encoder 403 initially can receive a message for transmission that will be moved through the communication channel 407.

The message to be encoded is a bit stream that can be denoted as k message symbols to be encoded into an n-symbol codeword. The k message symbols are denoted herein as $m_{k-1}, m_{k-2}, \ldots m_1, m_0$ and n codeword symbols are denoted as $c_{n-1}, c_{n-2}, \ldots c_1, c_0$. In general, message and codeword symbols are represented in polynomial forms such as m(x) and c(x) respectively, as given by equations (1) and (2), where x is a conceptual variable in a finite Galois field:

$$m(x) = m_{k-1}x^{k-1} + m_{k-2}x^{k-2} + \ldots + m_1 x + m_0 \quad (1)$$

$$c(x) = c_{n-1}x^{n-1} + c_{n-2}x^{n-2} + \ldots + c_1 x + g_0 \quad (2)$$

A BCH code is a polynomial code over a finite Galois field with a particularly chosen generator polynomial g(x) with degree (n−k). The chosen generator polynomial, alternatively referred to herein as an encoder polynomial, is given by equation (3), and the relationship between m(x), g(x) and c(x) is given by equation (4):

$$g(x) = g_{n-k}x^{n-k} + g_{n-k-1}x^{n-k-1} + \ldots g_1 x + g_0 \quad (3)$$

$$c(x) = m(x) \cdot g(x) \quad (4)$$

The encoder polynomial g(x) has a root α, which is a primitive number in a Galois field. The maximum number of correctable bits t in a BCH code is a property of the encoder polynomial g(x). Given t, the relationship (5) and (6) holds:

$$g(\alpha^j) = 0 \text{ for } j = 1, 2, \ldots 2t \quad (5)$$

$$c(\alpha^j) = 0 \text{ for } j = 1, 2, \ldots 2t \quad (6)$$

The BCH encoder 403 thus can produce a codeword c(x) according to the above described conditions. After encoding by the BCH encoder 403, and as is known in the art, the codeword c(x) is modulated by modulator 405. The codeword c(x) is thus included inside a transmission signal (TX signal) that is transmitted across the channel 407. The communication channel 407 refers to a physical transmission medium through which the TX signal is carried.

The demodulator 409 receives a signal from the communication channel 407 as a received signal (RX signal). The demodulator 409 separates a received BCH codeword r(x) from the RX signal, and outputs the received BCH codeword r(x) to the BCH decoder 411. The received BCH codeword r(x) may contain error bits if noise was acquired from the channel 407. If this is the case, the received code r(x) is different from the transmitted codeword c(x). When the received BCH codeword does not contain any error, the r(x) is the same as the transmitted codeword c(x). By denoting e(x) as the error created over the communication channel 407, r(x) can be represented as (7):

$$r(x) = c(x) + e(x) \quad (7)$$

The c(x) and e(x) are not known at the BCH decoder 411. Generally, it can be said that the BCH decoder 411 performs an analysis of the received code r(x) to determine the positions of any error bits e(x) from the received signal r(x). Once e(x) is estimated, the transmitted codeword c(x) is reconstructed according to equation (8):

$$c(x) = r(x) - e(x). \quad (8)$$

As is known in the art, syndrome decoding is a highly efficient method of decoding a linear code. Typical BCH decoders estimate e(x) based on 2t syndromes which are computed from the received BCH codeword r(x). The syndrome $S_j$, j=1, 2, ... 2t is defined according to equation (9):

$$S_j = r(\alpha^j), \text{ where } j = 1, 2, \ldots 2t \quad (9)$$

Equation (9) is alternatively referred to herein as a syndrome computation module.

From equations (6), (7), and (9), equation (10) holds for j=1, 2, . . . 2t:

$$S_j = c(\alpha^j) + e(\alpha^j) = e(\alpha^j) \quad (10)$$

Thus, when a received BCH codeword r(x) does not contain any error (that is, where e(x) is zero), the syndromes $S_j=0$ for j=1, 2, . . . 2t, indicating that r(x)=c(x). On the other hand, if e(x) is non-zero (that is, the communication channel created error due to noise), there should be at least one non-zero syndrome, where $S_j \neq 0$ for some j=1, 2, . . . 2t.

Once one or more syndromes have been determined, estimating e(x) can be further performed in two steps. The first step can be determining an error locator polynomial computation based on the syndromes. The second step can be the Chien search/error evaluation process. The detail of the error locator polynomial (ELP) computation is known in the art, and is not discussed at length herein. However, a general overview is now provided.

The error locator polynomial is defined as $\Lambda(x)$ by equation (11), and the roots of the error locator polynomial $\Lambda(x)$ provide the positions of errors:

$$\Lambda(x) = 1 + \Lambda_1 x + \Lambda_2 x^2 + \ldots + \Lambda_t x^t \quad (11)$$

In order to establish the roots of $\Lambda(x)$, the coefficients $\Lambda_1, \Lambda_2, \ldots \Lambda_t$ must first be determined. The coefficients of the error locator polynomial $\Lambda(x)$ of equation (11) for a binary BCH code can be computed from syndromes by solving the equation (12):

$$\begin{bmatrix} 1 & 0 & 0 & & \cdots & 0 & 0 \\ S_2 & S_1 & 1 & 0 & \cdots & 0 & 0 \\ S_4 & S_3 & S_2 & S_1 & \cdots & 0 & 0 \\ \vdots & \vdots & \vdots & \vdots & \ddots & & \vdots \\ S_{2t-2} & S_{2t-3} & S_{2t-4} & S_{2t-5} & \cdots & S_t & S_{t-1} \end{bmatrix} \begin{bmatrix} \Lambda_1 \\ \Lambda_2 \\ \Lambda_3 \\ \vdots \\ \Lambda_t \end{bmatrix} = - \begin{bmatrix} S_1 \\ S_3 \\ S_5 \\ \vdots \\ S_{2t-1} \end{bmatrix} \quad (12)$$

There are several known iterative algorithms to solve the coefficients $\Lambda_1, \Lambda_2, \ldots \Lambda_t$ from equation (12). These iterative algorithms are very efficient when the number of correctable errors t is large. One such algorithm is the Berlekamp-Massey (BKM) algorithm. When t>1, the complexity of BKM is proportional to 2t as it employs 2t Galois field multipliers. The latency of the same algorithm is reported as 2t clocks. It should be noted that the known iterative algorithms are implemented without Galois field divisions, thereby eliminating the need for Galois field dividers.

Once the coefficients $\Lambda_1, \Lambda_2, \ldots \Lambda_t$ of $\Lambda(x)$ have been determined, the roots of $\Lambda(x)$ as given by equation (11) can be resolved by known techniques. The Chien search/error evaluation process then identifies the position of the error bits e(x) using the determined roots of $\Lambda(x)$. The BCH decoder 411 of FIG. 4 can then determine the transmitted codeword c(x) from the received BCH codeword r(x) based on equation (8). The decoded codeword c(x) can then be output as a message from the BCH decoder 411 for further processing.

Figure 1:
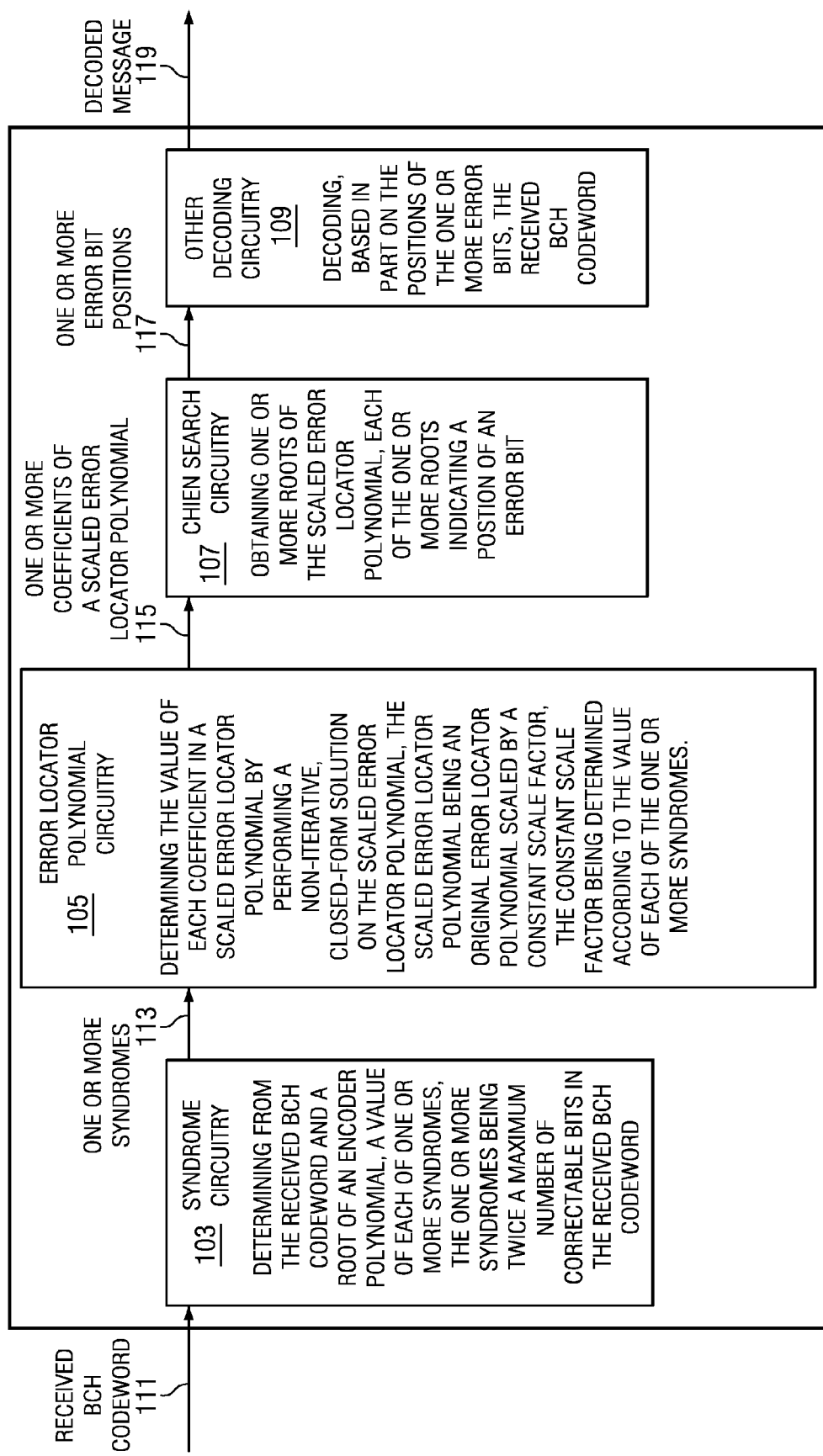
FIG. 1 is a block diagram illustrating a BCH decoder device that, during BCH decoding, utilizes a non-iterative, closed-form solution on a scaled error locator polynomial.

As further discussed herein below, various novel principles and combinations thereof are advantageously employed to reduce complexity in a BCH decoder, and in particular, to reduce complexity in an ELP solver module. Referring now to FIG. 1, a block diagram illustrating a novel BCH decoder device 101 that, during BCH decoding, utilizes a non-iterative, closed-form solution on a scaled error locator polynomial, will be discussed and described. The BCH decoder device 101 includes syndrome circuitry 103 that accepts a received BCH codeword 111 as input and outputs one or more syndromes 113; error locator polynomial circuitry 105 that accepts the syndromes 113 as input and outputs one or more coefficient $(\Lambda_1, \Lambda_2, \ldots \Lambda_t)$ 115 of a scaled error locator polynomial; Chien search circuitry 107 that accepts the one or more coefficients 115 of the scaled error locator polynomial as input and outputs one or more error bit positions 117; and other decoding circuitry that accepts the one or more error bit positions 117 as input and outputs a decoded message 119.

As mentioned above, the BCH decoder device 101 accepts a received BCH codeword 111 as input into the syndrome circuitry 103. As with a conventional BCH decoder, and as described above, the received BCH codeword 111 is given by equation (7) as r(x)=c(x)+e(x). As the BCH decoder device 101 also estimates e(x) from syndromes, the syndrome circuitry 103 can determine from the received BCH codeword r(x) and a root a of the encoder polynomial g(x), one or more syndromes 113 that are twice a maximum number of correctable bits t in the received BCH codeword r(x). The syndrome circuitry 103 calculates the one or more syndromes 113 in the manner give by equation (9) where one or more syndromes $S_j = r(\alpha^j)$, where j=1, 2, 2t, such that $S_j = c(\alpha^j) + e(\alpha^j) = e(\alpha^j)$. See equation (10). The one or more syndromes 113 can then be output by the syndrome circuitry 103 to the ELP circuitry 105.

The ELP circuitry 105 can use the one or more syndromes 113 received from the syndrome circuitry 103 to calculate the one or more coefficients of the error locator polynomial $\Lambda(x)$, given by equation (11) as $\Lambda(x) = 1 + \Lambda_1 x + \Lambda_2 x^2 + \ldots + \Lambda_t x^t$. In finding the coefficients of $\Lambda_1, \Lambda_2, \ldots \Lambda_t$ of $\Lambda(x)$, the BCH decoder 101 solves equation (12), given as $$\begin{bmatrix} 1 & 0 & 0 & & \cdots & 0 & 0 \\ S_2 & S_1 & 1 & 0 & \cdots & 0 & 0 \\ S_4 & S_3 & S_2 & S_1 & \cdots & 0 & 0 \\ \vdots & \vdots & \vdots & \vdots & \ddots & & \vdots \\ S_{2t-2} & S_{2t-3} & S_{2t-4} & S_{2t-5} & \cdots & S_t & S_{t-1} \end{bmatrix} \begin{bmatrix} \Lambda_1 \\ \Lambda_2 \\ \Lambda_3 \\ \vdots \\ \Lambda_t \end{bmatrix} = - \begin{bmatrix} S_1 \\ S_3 \\ S_5 \\ \vdots \\ S_{2t-1} \end{bmatrix}, \quad (12)$$

in a different manner than a conventional BCH decoder. Specifically, where the number of correctable bits t is small and below a certain threshold number of correctable bits, the BCH decoder 101 determines the value of each coefficient in a scaled error locator polynomial $\tilde{\Lambda}(x)$ by performing a non-iterative, closed-form solution on $\Lambda(x)$. $\tilde{\Lambda}(x)$ is simply an error locator polynomial that is $\Lambda(x)$ scaled by a constant factor $c_0$, $c_0$ being determined according the value of the one or more syndromes 113. Because $\tilde{\Lambda}(x)$ is scaled from $\Lambda(x)$, solving the coefficients of $\tilde{\Lambda}(x)$ and determining the roots of the $\tilde{\Lambda}(x)$ also determines the roots of the ELP $\Lambda(x)$.

The operation of the ELP circuitry 105 is now explained in more detail. The beginning premise is that when t is small and below a certain threshold number of correctable bits, a non-iterative closed-form solution can be performed on an ELP by the ELP circuitry 105. It should first be noted that equation (12) has the equivalent linear equation form:

$$A \begin{bmatrix} \Lambda_1 \\ \Lambda_2 \\ \vdots \\ \Lambda_t \end{bmatrix} = \begin{bmatrix} S_1 \\ S_1 \\ \vdots \\ S_{2t-1} \end{bmatrix} \quad (13)$$

where $$A = \begin{bmatrix} 1 & 0 & 0 & \cdots \\ S_2 & S_1 & 1 & \cdots \\ \vdots & & & \\ S_{2t-2} & S_{2t-3} & S_{2t-4} & \cdots \end{bmatrix}.$$

Closed-form solutions for $\Lambda_1, \Lambda_2, \ldots \Lambda_t$ of the ELP $\Lambda(x)$ can be calculated by simply computing:

$$\begin{bmatrix} \Lambda_1 \\ \Lambda_2 \\ \vdots \\ \Lambda_t \end{bmatrix} = A^{-1} \begin{bmatrix} S_1 \\ S_1 \\ \vdots \\ S_{2t-1} \end{bmatrix}. \quad (14)$$

Solving equation (14) for $t \leq 4$ provides the closed-form solutions shown in Table 1:

TABLE 1

Closed-Form Solution and Complexity of the Error Locator Polynominal Computation

| t | Analytical Closed-form Solution for $\Lambda_1, \Lambda_2, \ldots \Lambda_t$ | Complexity-Number of Galois Field Multiplications | Complexity-Number of Galois Field Divisions |
|---|---|---|---|
| 1 | $\Lambda_1 = S_1$ | 0 | 0 |
| 2 | $\Lambda_1 = S_1, \Lambda_2 = \dfrac{S_3 + S_1^3}{S_1}$ | 2 | 1 |
| 3 | $\Lambda_1 = S_1, \Lambda_2 = \dfrac{S_1^2 S_3 + S_5}{S_1^3 + S_3}$, $\Lambda_3 = S_1^3 + S_3 + S_1\Lambda_2$ | 4 | 1 |
| 4 | $\Lambda_1 = S_1$, $\Lambda_2 = \dfrac{S_1(S_7 + S_1^7) + S_3(S_5 + S_1^5)}{S_3(S_1^3 + S_3) + S_1(S_5 + S_1^5)}$, $\Lambda_3 = (S_1^3 + S_3) + S_1\Lambda_2$, $\Lambda_4 = \dfrac{(S_5 + S_3 S_1^2) + \Lambda_2(S_1^3 + S_3)}{S_1}$, | 11 | 2 |

In order to fairly compare the complexity of the closed-form solutions in Table 1 with that of an iterative (BKM) algorithm, a latency of 2t clocks is allowed for computing the closed-form solutions. A single multiplier can be time shared to compute 2t multiplications during 2t clocks.

Table 2 below then demonstrates the number of Galois field multiplier and divider instances for computing the closed-form solutions. It also provides the number of Galois field multipliers for the iterative (BKM) algorithm for comparison purposes.

TABLE 2

Complexity Comparison of Closed-form Solution vs. Iterative Algorithm

| t | Number of Multipliers and Dividers for Analytical Closed-form Solution (Latency = 2t) | Number of Multipliers and Dividers for Iterative (BKM) Algorithm (Latency = 2t) |
|---|---|---|
| 1 |  | 0 Multiplier, 0 Divider |
| 2 | 1 Multiplier, 1 Divider | 2t Multipliers, 0 Divider |
| 3 | 1 Multiplier, 1 Divider |  |

TABLE 2-continued

Complexity Comparison of Closed-form Solution vs. Iterative Algorithm

| t | Number of Multipliers and Dividers for Analytical Closed-form Solution (Latency = 2t) | Number of Multipliers and Dividers for Iterative (BKM) Algorithm (Latency = 2t) |
|---|---|---|
| 4 | 2 Multipliers, 1 Divider |  |

Although the complexity of closed-form solutions on an error locator polynomial is typically lower than that of iterative solutions when t is small, the Galois field division involved in computing the closed-form solutions is not desirable: the complexity and latency of Galois field division is greater than of Galois field multiplication. The complexity of the closed-solutions can thus be further reduced by eliminating Galois field division from the process of finding the coefficients of an error locator polynomial. In order to eliminate Galois field division, the ELP circuitry 105 determines the value of each coefficient the in a scaled error locator polynomial by performing a non-iterative, closed-form solution on the scaled error locator polynomial.

As mentioned above, the scaled error locator polynomial $\tilde{\Lambda}(x)$ is $\Lambda(x)$ scaled by constant factor $c_0$ that is determined according the value of the one or more syndromes 113. Because $\tilde{\Lambda}(x)$ is scaled from $\Lambda(x)$, solving the coefficients of $\tilde{\Lambda}(x)$ and determining the roots of $\tilde{\Lambda}(x)$ also determines the roots of $\Lambda(x)$. Further, the roots of $\tilde{\Lambda}(x)$ and $\Lambda(x)$ determine the positions of one or more errors in the received BCH codeword r(x). That is to say, an identical BCH decoding result, which is in part an estimate of the error polynomial e(x), can be obtained from any error locator polynomial as long as it has the same roots as an original $\Lambda(x)$. Thus a scaled error locator polynomial is given by equation (14) where $c_0$ is a constant scale factor:

$$\tilde{\Lambda}(x) = c_0 \cdot \Lambda(x) \quad (15)$$

Simple algebra dictating that $\tilde{\Lambda}(x)$ has the same roots as $\Lambda(x)$, a closed-form solution on $\tilde{\Lambda}(x)$ can be calculated by the ELP circuitry 105. The ELP circuitry 105 will output the same one or more roots as if the ELP circuitry 105 were calculating the one or more roots of $\Lambda(x)$, given that the constant $c_0$ is not zero. However, the objective still remains to eliminate Galois field division in calculating coefficients of the scaled $\tilde{\Lambda}(x)$.

In order to eliminate the Galois field division, the scaling constant $c_0$ can be adjusted. This is done by setting $c_0$ as the product of denominator terms in the original coefficients $\Lambda_1$, $\Lambda_2$, ... and $\Lambda_t$ from $\Lambda(x)$. Thus for example when t=4, from Table 1 is it seen that:

$$\Lambda_1 = S_1,$$
$$\Lambda_2 = \frac{S_1(S_7 + S_1^7) + S_3(S_5 + S_1^5)}{S_3(S_1^3 + S_3) + S_1(S_5 + S_1^5)},$$
$$\Lambda_3 = (S_1^3 + S_3) + S_1\Lambda_2,$$
$$\Lambda_4 = \frac{(S_5 + S_3 S_1^2) + \Lambda_2(S_1^3 + S_3)}{S_1},$$

and
the denominator terms are calculated as $S_3(S_1^3 + S_3) + S_1(S_5 + S_1^5)$ and $S_1$. The scaling constant $c_0$ is therefore set to be $(S_3(S_1^3 + S_3) + S_1(S_5 + S_1^5)) \cdot S_1$.

Table 3 demonstrates additional details about the scaling constant $c_0$ and the coefficients of $\tilde{\Lambda}(x)$. The left side of Table 3 provides the constant $c_0$ of each t where $t \leq 4$. The right side of Table 3 provides, for each t where $t \leq 4$, the closed form solutions of $\tilde{\Lambda}_1, \tilde{\Lambda}_2 \ldots$ and $\tilde{\Lambda}_t$ of $\tilde{\Lambda}(x)$. It should be noted that the coefficients $\tilde{\Lambda}_1, \tilde{\Lambda}_2 \ldots$ and $\tilde{\Lambda}_t$ are calculated in a manner as given by equations (13), (14), and (15).

See Table 3 below:

TABLE 3

Closed-form Solution for Scaled Error Locator Polynomial

| T | The scaling constant $c_0$ | Scaled error locator polynomial $\tilde{\Lambda}(x)$ |
|---|---|---|
| 1 | 1 | $\tilde{\Lambda}(x) = 1 + \tilde{\Lambda}_1 x$ |
|   |   | $\tilde{\Lambda}_1 = S_1$ |
| 2 | $c_0 = S_1$ | $\tilde{\Lambda}(x) = c_0 + \tilde{\Lambda}_1 x + \tilde{\Lambda}_2 x^2$ |
|   |   | $\tilde{\Lambda}_1 = S_1^2, \tilde{\Lambda}_2 = S_3 + S_1^3$ |
| 3 | $c_0 = S_1^3 + S_3$ | $\tilde{\Lambda}(x) = c_0 + \tilde{\Lambda}_1 x + \tilde{\Lambda}_2 x^2 + \tilde{\Lambda}_3 x^3$ |
|   |   | $\tilde{\Lambda}_1 = c_0 S_1, \tilde{\Lambda}_2 = S_1^2 S_3 + S_5, \tilde{\Lambda}_3 = c_0^2 + S_1 \cdot \tilde{\Lambda}_2$ |
| 4 | $\tilde{c}_0 = S_3(S_1^3 + S_3) + S_1(S_5 + S_1^5)$ | $\tilde{\Lambda}(x) = c_0 + \tilde{\Lambda}_1 x + \tilde{\Lambda}_2 x^2 + \tilde{\Lambda}_3 x^3 + \tilde{\Lambda}_4 x^4$ |
|   | $c_0 = S_1 \tilde{c}_0$ | $\overline{\Lambda}_2 = (S_1(S_7 + S_1^7) + S_3(S_5 + S_1^5))$ |
|   |   | $\tilde{\Lambda}_1 = S_1 c_0$ |
|   |   | $\tilde{\Lambda}_2 = S_1 \overline{\Lambda}_2$ |
|   |   | $\tilde{\Lambda}_3 = c_0(S_1^3 + S_3) + S_1^2 \overline{\Lambda}_2$ |
|   |   | $\tilde{\Lambda}_4 = \tilde{c}_0(S_5 + S_3 S_1^2) + (S_1^3 + S_3)\overline{\Lambda}_2$ |

A careful inspection of the calculations of the coefficients $\tilde{\Lambda}_1, \tilde{\Lambda}_2 \ldots$ and $\tilde{\Lambda}_t$ of the scaled, closed-form error locator polynomial $\tilde{\Lambda}(x)$, for all t, reveals that division is not required. However, as described above, $\tilde{\Lambda}(x)$ has the identical roots as the original error locator polynomial $\Lambda(x)$. Thus calculating a closed-form solution to a scaled ELP is of lower complexity than both calculating an iterative solution to an ELP and calculating a closed-form solution to an ELP where division is required.

Table 4 summarizes the complexity of the closed-form solution to a scaled ELP when the allowed latency is 2t clocks. Table 4 reveals that the complexity of the proposed solution is significantly lower than a conventional iterative (BKM) algorithm. For example, when t=4, the complexity of the closed form solution to the scaled ELP is proportional to 2 (the number of Galois field multipliers). In contrast, the complexity of the conventional iterative (BKM) algorithm is proportional to 8 (equivalent to 2t Galois field multipliers). To summarize, for t=4, there is a 4× improvement in complexity by employing a closed form solution on a scaled ELP over an iterative algorithm.

TABLE 4

Complexity Comparison of Closed-form Solution (Scaled ELP) vs. Iterative Algorithm

| T | Number of Multipliers and Dividers for Analytical Closed-form Solution (Latency = 2t) | Number of Multipliers and Dividers for Iterative (BKM) Algorithm (Latency = 2t) |
|---|---|---|
| 1 |   | 0 multiplier, 0 divider |
| 2 | 1 multiplier, 0 divider | 2t multipliers, 0 divider |
| 3 | 1 multiplier, 0 divider |   |
| 4 | 2 multipliers, 0 divider |   |

To summarize the operation of the ELP circuitry 105, when the number of correctable bits t is below a certain threshold number of correctable bits, the ELP circuitry 105 determines the value of each coefficient of a scaled error locator polynomial $\tilde{\Lambda}(x)$ by performing a non-iterative, closed-form solution on $\tilde{\Lambda}(x)$. The scaled $\tilde{\Lambda}(x)$ is $\Lambda(x)$ scaled by constant factor $c_0$ that is determined according the value of the one or more syndromes 113. The ELP circuitry 105 obtains one or more coefficients 115 of $\tilde{\Lambda}(x)$, and outputs the one or more coefficients 115 of $\tilde{\Lambda}(x)$ to the Chien search circuitry 107.

The Chien search circuitry 107 then performs a Chien search and error evaluation process. The Chien search and error evaluation process determines one or more roots of $\tilde{\Lambda}(x)$ and determines one or more error bits positions 117 based on the received one or more coefficients 115 of $\tilde{\Lambda}(x)$. The Chien search circuitry then outputs the one or more error bit positions 117 to the other decoding circuitry 109.

The other decoding circuitry 109 receives the one or more error bit positions 117 as input. Using the one or more error bit positions 117, the other decoding circuitry 109 decodes using known techniques the received BCH codeword 111. Having decoded the received BCH codeword 111, the other decoding circuitry 109 outputs a decoded message 119 for further processing.

Figure 2:
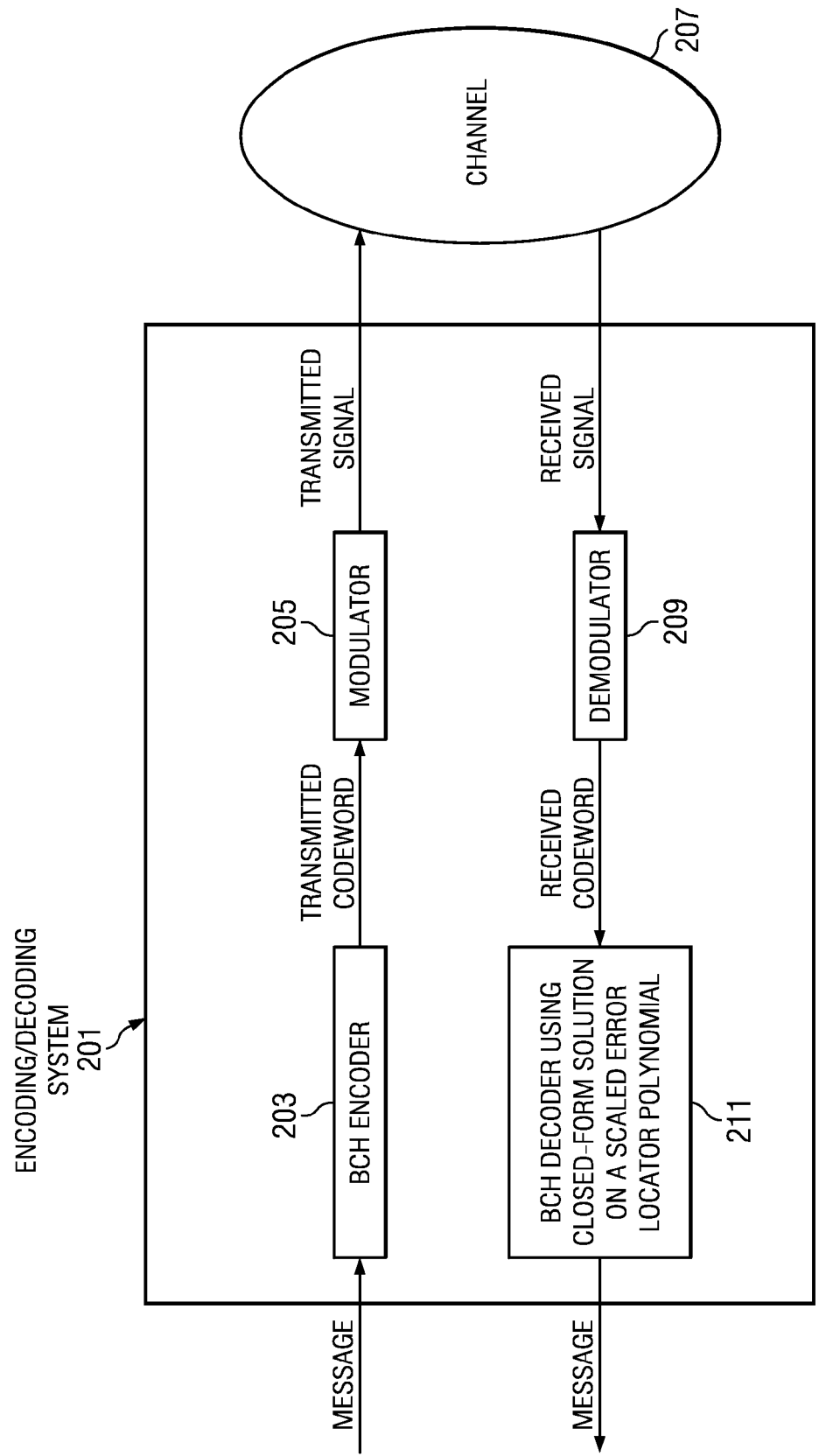
FIG. 2 is a block diagram illustrating a BCH encoded/decoder system with a BCH decoder utilizing a non-iterative, closed-form solution on a scaled error locator polynomial.

Referring now to FIG. 2, a block diagram illustrating a BCH encoded/decoder system 201 with a BCH decoder utilizing a non-iterative, closed-form solution on a scaled error locator polynomial will be discussed and described. The BCH encoder/decoder system 201 includes a BCH encoder 203, a modulator 205, a channel 207, a demodulator 209, and a novel BCH decoder device 211. FIG. 2 is provided to illustrate simply that a BCH decoder device 211, being of the same type as the BCH decoder device 101 illustrated in FIG. 1, can be included in a traditional BCH encoder/decoder system. In the illustration, the functioning of each component of the BCH encoder/decoder system 201 is the operates similarly to the corresponding components of the BCH encoder/decoder system 401 illustrated in FIG. 4, with the exception of the BCH decoder device 211.

The BCH decoder 211 of FIG. 2 of course operates differently from the BCH decoder device 411 of FIG. 4. Specifically, as described above the BCH decoder device 411 of FIG. 4 uses an iterative solution in order to determine the coefficients of an ELP. In contrast, the BCH decoder device 211, being of the form of the BCH decoder device 101 of FIG. 1, uses a closed-form solution on a scaled ELP. Because of this fact, the BCH decoder device 211 of FIG. 2 will have lower complexity than the BCH decoder device 411 of FIG. 4.

Figure 3:
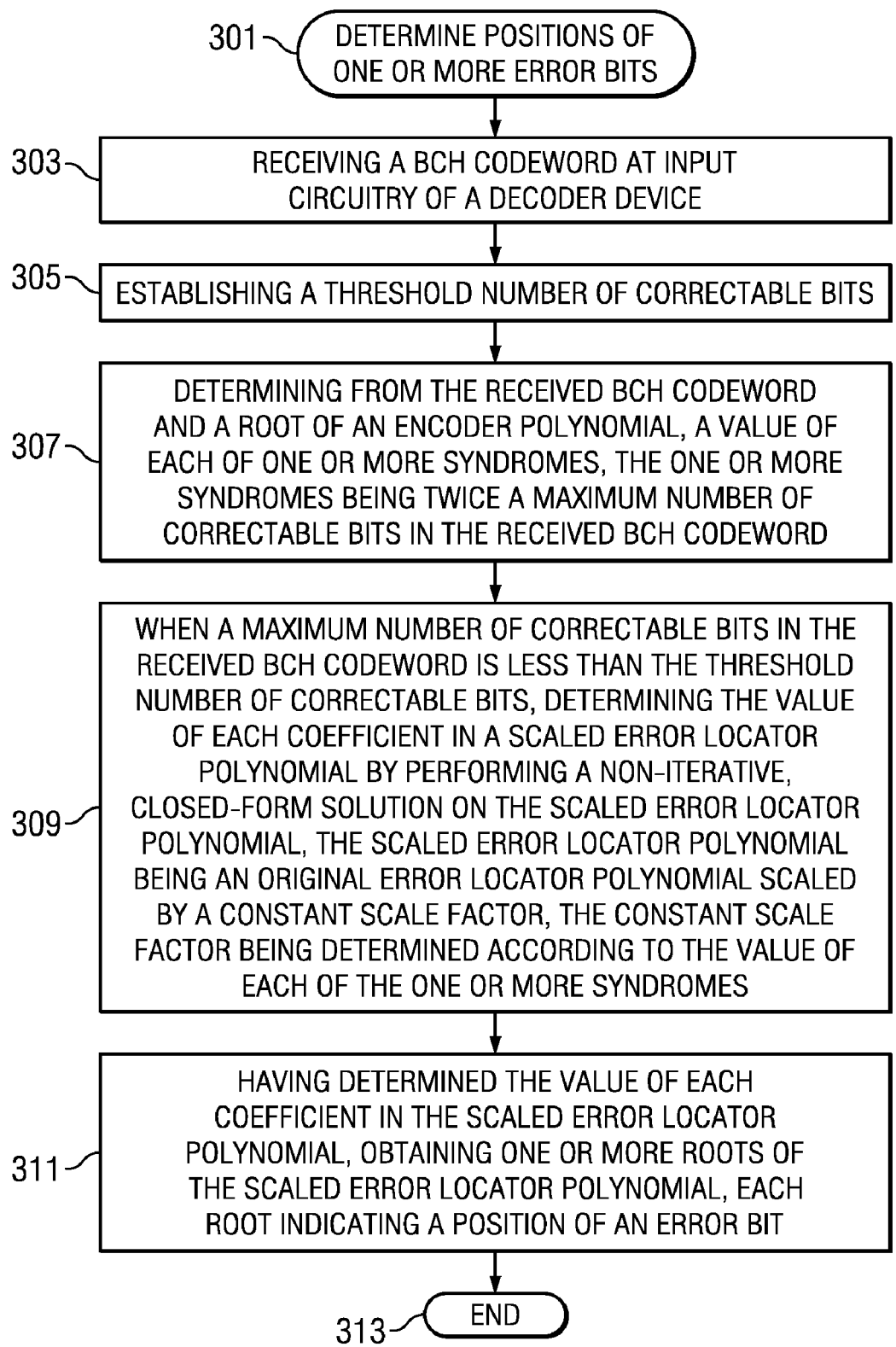
FIG. 3 is a flow chart illustrating a method of determining positions of one or more error bits.

Referring now to FIG. 3, a flow chart illustrating a method 301 of determining positions of one or more error bits will be discussed and described. The method 301 of determining positions of one or more error bits initially includes receiving 303 a BCH codeword at input circuitry of a decoder device. The method further includes establishing 305 a threshold number of correctable bits. The threshold number can be predetermined or hardwired or dynamically set based on knowledge of the complexity used for a closed form solution on a scaled ELP in contrast with the complexity of an iterative solution to an original, non-scaled ELP.

The method 301 further includes determining 307 from the received BCH codeword and a root of an encoder polynomial, a value of each of one or more syndromes, the one or more syndromes being twice a maximum number of correctable bits in the received BCH codeword. The method 301 further includes when the maximum number of correctable bits in the received BCH codeword is less than the threshold number of correctable bits, determining 309 the value of each coefficient in a scaled error locator polynomial by performing a non-iterative, closed-form solution on the scaled error locator polynomial, the scaled error locator polynomial being an original error locator polynomial scaled by a constant scale factor, the constant scale factor being determined according to the value of each of the one or more syndromes. The method 301 finally includes having determined the value of each coefficient in the scaled error locator polynomial, obtaining 311 one or more roots of the scaled error locator polynomial, each of the one or more roots indicating a position of an error bit. The method 301 of determining positions of one or more error bits then ends 313.

It should be noted that in the method 301 of determining positions of one or more error bits, the received BCH codeword is a sum of a transmitted BCH codeword and the one or more error bits. Additionally, the transmitted BCH codeword is a product of a bit stream message and the encoder polynomial. Further, the maximum number of correctable bits in the received BCH codeword is a property of the encoder polynomial. Finally, the root of the encoder polynomial is a primitive number in a finite Galois field.

As used herein, the term "complexity" refers to the number and/or size of hardware circuitry to used implement particular computations given a set latency.

As used herein, the term "multiplier" or "Galois field multiplier" refers to the hardware circuitry used to implement the operations of Galois field multiplication.

As used herein, the term "divider" or "Galois field divider" refers to the hardware circuitry used to implement the operations of Galois field division.

As used herein, the term "circuitry" or "hardware circuitry" refers to digital electronic circuits wherein electric signals take on discrete values to represent logical and numeric values. The values represent the information being processed This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of determining positions of one or more error bits, the method comprising:

receiving a BCH codeword at input circuitry of a decoder device;

establishing a threshold number of correctable bits;

determining from the received BCH codeword and a root of an encoder polynomial, a value of each of one or more syndromes, the one or more syndromes being twice a maximum number of correctable bits in the received BCH codeword;

when the maximum number of correctable bits in the received BCH codeword is less than the threshold number of correctable bits, determining the value of each coefficient in a scaled error locator polynomial by performing a non-iterative, closed-form solution on the scaled error locator polynomial, the scaled error locator polynomial being an original error locator polynomial scaled by a constant scale factor, the constant scale factor being determined according to the value of each of the one or more syndromes; and having determined the value of each coefficient in the scaled error locator polynomial, obtaining one or more roots of the scaled error locator polynomial, each of the one or more roots indicating a position of an error bit, wherein the received BCH codeword is a sum of the transmitted BCH codeword and the one or more error bits, the transmitted BCH codeword is a product of a bit stream message and the encoder polynomial, the maximum number of correctable bits in the received BCH codeword is a property of the encoder polynomial, and the root of the encoder polynomial is a primitive number in a finite Galois field.

2. The method of claim 1, wherein x is a conceptual variable in the finite Galois field, m(x) denotes the bit stream message, the bit stream message being k message symbols before encoding where $m(x) = m_{k-1}x^{k-1} + m_{k-2}x^{k-2} + \ldots + m_1 x + m_0$, c(x) denotes the transmitted BCH codeword, the received BCH codeword being an encoded n-symbol codeword, g(x) denotes the encoder polynomial, the encoder polynomial being of degree (n−k) where $$g(x) = g_{n-k}x^{n-k} + g_{n-k-1}x^{n-k-1} + \ldots g_1 x + g_0, \text{ and}$$

$$c(x) = c_{n-1}x^{n-1} + c_{n-2}x^{n-2} + \ldots + c_1 x + g_0.$$

3. The method of claim 2, wherein r(x) denotes the received BCH codeword, e(x) denotes the one or more error bits, r(x)=c(x)+e(x), α denotes the root of the generator polynomial, t denotes the maximum number of correctable bits in the received BCH codeword, $S_j$ denotes the value of the one or more syndromes for j=1, 2, ... 2t, and $$S_j = r(\alpha^j) = c(\alpha^j) + e(\alpha^j).$$

4. The method of claim 3, wherein
$\Lambda(x)$ denotes the original error locator polynomial where $\Lambda(x)=1+\Lambda_1 x+\Lambda_2 x^2+\ldots+\Lambda_t x^t$, $\tilde{\Lambda}(x)$ denotes the scaled error locator polynomial $\tilde{\Lambda}(x)=c_0\cdot\Lambda(x)$, $c_0$ being the constant scale factor, and
when $t\leq 4$, determining the value of each coefficient in $\tilde{\Lambda}(x)$ by performing a non-iterative, closed-form solution on $\tilde{\Lambda}(x)$ is given by:

| T | $c_0$ | $\tilde{\Lambda}(x)$ |
|---|---|---|
| 1 | 1 | $\tilde{\Lambda}(x) = 1 + \tilde{\Lambda}_1 x$ |
|   |   | $\tilde{\Lambda}_1 = S_1$ |
| 2 | $c_0 = S_1$ | $\tilde{\Lambda}(x) = c_0 + \tilde{\Lambda}_1 x + \tilde{\Lambda}_2 x^2$ |
|   |   | $\tilde{\Lambda}_1 = S_1^2, \tilde{\Lambda}_2 = S_3 + S_1^3$ |
| 3 | $c_0 = S_1^3 + S_3$ | $\tilde{\Lambda}(x) = c_0 + \tilde{\Lambda}_1 x + \tilde{\Lambda}_2 x^2 + \tilde{\Lambda}_3 x^3$ |
|   |   | $\tilde{\Lambda}_1 = c_0 S_1, \tilde{\Lambda}_2 = S_1^2 S_3 + S_5, \tilde{\Lambda}_3 = c_0^2 + S_1 \cdot \tilde{\Lambda}_2$ |
| 4 | $\tilde{c}_0 = S_3(S_1^3 + S_3) + S_1(S_5 + S_1^5)$ | $\tilde{\Lambda}(x) = c_0 + \tilde{\Lambda}_1 x + \tilde{\Lambda}_2 x^2 + \tilde{\Lambda}_3 x^3 + \tilde{\Lambda}_4 x^4$ |
|   | $c_0 = S_1 \tilde{c}_0$ | $\overline{\Lambda}_2 = (S_1(S_7 + S_1^7) + S_3(S_5 + S_1^5))$ |
|   |   | $\tilde{\Lambda}_1 = S_1 c_0$ |
|   |   | $\tilde{\Lambda}_2 = S_1 \overline{\Lambda}_2$ |
|   |   | $\tilde{\Lambda}_3 = c_0(S_1^3 + S_3) + S_1^2 \overline{\Lambda}_2$ |
|   |   | $\tilde{\Lambda}_4 = \tilde{c}_0(S_5 + S_3 S_1^2) + (S_1^3 + S_3)\overline{\Lambda}_2$. |

5. The method of claim 1, wherein
the maximum number of correctable bits in the received BCH codeword is less than or equal to 4.

6. The method of claim 1, further comprising:
performing a Chien search and error evaluation process, thereby determining the positions of the one or more error bits.

7. The method of claim 1, further comprising:
outputting a signal representing the indicated positions of the one or more error bits.

8. A decoder device comprising:
syndrome computation circuitry; and
error location polynomial (ELP) computation circuitry; and
Chien search and error circuitry,
the ELP computation circuitry establishing a threshold number of correctable bits;
the syndrome computation circuitry determining from a received BCH codeword and a root of an encoder polynomial, a value of each of one or more syndromes, the one or more syndromes being twice a maximum number of correctable bits in the received BCH codeword;
the ELP computation circuitry determining, when the maximum number of correctable bits in the received BCH codeword is less than the threshold number of correctable bits, a value of each coefficient in a scaled error locator polynomial by utilizing a non-iterative, closed-form solution on the scaled error locator polynomial, the scaled error locator polynomial being an original error locator polynomial scaled by a constant scale factor, the constant scale factor being calculated according to the value of each of the one or more syndromes determined by the syndrome computation circuitry;
the ELP computation circuitry having determined the value of each coefficient in the scaled error locator polynomial, the Chien search and error circuitry further obtaining one or more roots of the scaled error locator polynomial, each one of the one or more roots indicating a position of an error bit, wherein
the received BCH codeword is a sum of the transmitted BCH codeword and one or more error bits,
the transmitted BCH codeword is a product of a bit stream message and the encoder polynomial,
the maximum number of correctable bits in the received BCH codeword is a property of the encoder polynomial, and
the root of the encoder polynomial is a primitive number in a finite Galois field.

9. The decoder device of claim 8, wherein
x is a conceptual variable in the finite Galois field,
m(x) denotes the bit stream message, the bit stream message being k message symbols before encoding where
$m(x)=m_{k-1}x^{k-1}+m_{k-2}x^{k-2}+\ldots+m_1 x+m_0$,
c(x) denotes the transmitted BCH codeword, the received BCH codeword being an encoded n-symbol codeword,
g(x) denotes the encoder polynomial, the encoder polynomial being of degree (n-k) where $g(x)=g_{n-k}x^{n-k}+g_{n-k-1}x^{n-k-1}+\ldots g_1 x+g_0$, and $c(x)=c_{n-1}x^{n-1}+c_{n-2}x^{n-2}+\ldots+c_1 x+g_0$.

10. The decoder device of claim 9, wherein
r(x) denotes the received BCH codeword,
e(x) denotes the one or more error bits, $r(x)=c(x)+e(x)$, $\alpha$ denotes the root of the generator polynomial,
t denotes the maximum number of correctable bits in the received BCH codeword,
$S_j$ denotes the value of the one or more syndromes for j=1, 2, . . . 2t, and $S_j=r(\alpha^j)=c(\alpha^j)+e(\alpha^j)$.

11. The decoder device of claim 10, wherein
$\Lambda(x)$ denotes the original error locator polynomial where $\Lambda(x)=1+\Lambda_1 x+\Lambda_2 x^2+\ldots+\Lambda_t x^t$, $\tilde{\Lambda}(x)$ denotes the scaled error locator polynomial $\tilde{\Lambda}(x)=c_0\cdot\Lambda(x)$, $c_0$ being the constant scale factor, and
when $t\leq 4$, determining the value of each coefficient in $\tilde{\Lambda}(x)$ by performing a non-iterative, closed-form solution on $\tilde{\Lambda}(x)$ is given by:

| T | $c_0$ | $\tilde{\Lambda}(x)$ |
|---|---|---|
| 1 | 1 | $\tilde{\Lambda}(x) = 1 + \tilde{\Lambda}_1 x$ |
|   |   | $\tilde{\Lambda}_1 = S_1$ |
| 2 | $c_0 = S_1$ | $\tilde{\Lambda}(x) = c_0 + \tilde{\Lambda}_1 x + \tilde{\Lambda}_2 x^2$ |
|   |   | $\tilde{\Lambda}_1 = S_1^2, \tilde{\Lambda}_2 = S_3 + S_1^3$ |
| 3 | $c_0 = S_1^3 + S_3$ | $\tilde{\Lambda}(x) = c_0 + \tilde{\Lambda}_1 x + \tilde{\Lambda}_2 x^2 + \tilde{\Lambda}_3 x^3$ |
|   |   | $\tilde{\Lambda}_1 = c_0 S_1, \tilde{\Lambda}_2 = S_1^2 S_3 + S_5, \tilde{\Lambda}_3 = c_0^2 + S_1 \cdot \tilde{\Lambda}_2$ |
| 4 | $\tilde{c}_0 = S_3(S_1^3 + S_3) + S_1(S_5 + S_1^5)$ | $\tilde{\Lambda}(x) = c_0 + \tilde{\Lambda}_1 x + \tilde{\Lambda}_2 x^2 + \tilde{\Lambda}_3 x^3 + \tilde{\Lambda}_4 x^4$ |
|   | $c_0 = S_1 \tilde{c}_0$ | $\overline{\Lambda}_2 = (S_1(S_7 + S_1^7) + S_3(S_5 + S_1^5))$ |
|   |   | $\tilde{\Lambda}_1 = S_1 c_0$ |
|   |   | $\tilde{\Lambda}_2 = S_1 \overline{\Lambda}_2$ |
|   |   | $\tilde{\Lambda}_3 = c_0(S_1^3 + S_3) + S_1^2 \overline{\Lambda}_2$ |
|   |   | $\tilde{\Lambda}_4 = \tilde{c}_0(S_5 + S_3 S_1^2) + (S_1^3 + S_3)\overline{\Lambda}_2$. |

12. The decoder device of claim 8, wherein
the maximum number of correctable bits in the received BCH codeword is less than or equal to 4.

13. The decoder device of claim 8,
the Chien search circuitry further determines and output one or more error bit positions.

14. The decoder device of claim 13, further comprising:
other decoding circuitry decoding, based in part on the positions of the one or more error bits, the received BCH codeword.

15. A digital circuit with components configured to preserve operations, the operations implementing a method of determining positions of one or more error bits, the method comprising:
  receiving a BCH codeword at input circuitry of a decoder device;
  establishing a threshold number of correctable bits;
  determining from the received BCH codeword and a root of an encoder polynomial, a value of each of one or more syndromes, the one or more syndromes being twice a maximum number of correctable bits in the received BCH codeword;
  when the maximum number of correctable bits in the received BCH codeword is less than the threshold number of correctable bits, determining the value of each coefficient in a scaled error locator polynomial by performing a non-iterative, closed-form solution on the scaled error locator polynomial, the scaled error locator polynomial being an original error locator polynomial scaled by a constant scale factor, the constant scale factor being determined according to the value of each of the one or more syndromes; and
  having determined the value of each coefficient in the scaled error locator polynomial, obtaining one or more roots of the scaled error locator polynomial, each of the one or more roots indicating a position of an error bit, wherein
    the received BCH codeword is a sum of the transmitted BCH codeword and the error bits,
    the transmitted BCH codeword is a product of a bit stream message and the encoder polynomial,
    the maximum number of correctable bits in the received BCH codeword is a property of the encoder polynomial, and
    the root of the encoder polynomial is a primitive number in a finite Galois field.

16. The digital circuit of claim 15, wherein
  x is a conceptual variable in the finite Galois field,
  m(x) denotes the bit stream message, the bit stream message being k message symbols before encoding where $m(x) = m_{k-1}x^{k-1} + m_{k-2}x^{k-2} + \ldots + m_1 x + m_0$,
  c(x) denotes the transmitted BCH codeword, the received BCH codeword being an encoded n-symbol codeword,
  g(x) denotes the encoder polynomial, the encoder polynomial being of degree (n−k) where
  $g(x) = g_{n-k}x^{n-k} + g_{n-k-1}x^{n-k-1} + \ldots + g_1 x + g_0$, and
  $c(x) = c_{n-1}x^{n-1} + c_{n-2}x^{n-2} + \ldots + c_1 x + g_0$.

17. The digital circuit of claim 16, wherein
  r(x) denotes the received BCH codeword,
  e(x) denotes the one or more error bits,
  $r(x) = c(x) + e(x)$,
  α denotes the root of the generator polynomial,
  t denotes the maximum number of correctable bits in the received BCH codeword,
  $S_j$ denotes the value of the one or more syndromes for j=1, 2, ... 2t, and
  $S_j = r(\alpha^j) = c(\alpha^j) + e(\alpha^j)$.

18. The digital circuit of claim 17, wherein
Λ(x) denotes the original error locator polynomial where
$\Lambda(x) = 1 + \Lambda_1 x + \Lambda_2 x^2 + \ldots + \Lambda_t x^t$,
$\tilde{\Lambda}(x)$ denotes the scaled error locator polynomial $\tilde{\Lambda}(x) = c_0 \cdot \Lambda(x)$, $c_0$ being the constant scale factor, and
when t≦4, determining the value of each coefficient in $\tilde{\Lambda}(x)$ by performing a non-iterative, closed-form solution on $\tilde{\Lambda}(x)$ is given by:

| T | $c_0$ | $\tilde{\Lambda}(x)$ |
|---|---|---|
| 1 | 1 | $\tilde{\Lambda}(x) = 1 + \tilde{\Lambda}_1 x$ |
|   |   | $\tilde{\Lambda}_1 = S_1$ |
| 2 | $c_0 = S_1$ | $\tilde{\Lambda}(x) = c_0 + \tilde{\Lambda}_1 x + \tilde{\Lambda}_2 x^2$ |
|   |   | $\tilde{\Lambda}_1 = S_1^2, \tilde{\Lambda}_2 = S_3 + S_1^3$ |
| 3 | $c_0 = S_1^3 + S_3$ | $\tilde{\Lambda}(x) = c_0 + \tilde{\Lambda}_1 x + \tilde{\Lambda}_2 x^2 + \tilde{\Lambda}_3 x^3$ |
|   |   | $\tilde{\Lambda}_1 = c_0 S_1, \tilde{\Lambda}_2 = S_1^2 S_3 + S_5, \tilde{\Lambda}_3 = c_0^2 + S_1 \cdot \tilde{\Lambda}_2$ |
| 4 | $\tilde{c}_0 = S_3(S_1^3 + S_3) + S_1(S_5 + S_1^5)$ | $\tilde{\Lambda}(x) = c_0 + \tilde{\Lambda}_1 x + \tilde{\Lambda}_2 x^2 + \tilde{\Lambda}_3 x^3 + \tilde{\Lambda}_4 x^4$ |
|   |   | $\overline{\Lambda}_2 = (S_1(S_7 + S_1^7) + S_3(S_5 + S_1^5))$ |
|   | $c_0 = S_1 \tilde{c}_0$ | $\tilde{\Lambda}_1 = S_1 c_0$ |
|   |   | $\tilde{\Lambda}_2 = S_1 \overline{\Lambda}_2$ |
|   |   | $\tilde{\Lambda}_3 = c_0(S_1^3 + S_3) + S_1^2 \overline{\Lambda}_2$ |
|   |   | $\tilde{\Lambda}_4 = \tilde{c}_0(S_5 + S_3 S_1^2) + (S_1^3 + S_3)\overline{\Lambda}_2.$ |

19. The digital circuit of claim 15, wherein
the maximum number of correctable bits in the received BCH codeword is less than or equal to 4.

20. The digital circuit of claim 15, wherein
the components are further configured to output a signal representing the determined positions of the one or more error bits.

* * * * *